United States Patent
Reddy et al.

(10) Patent No.: US 7,313,771 B2
(45) Date of Patent: Dec. 25, 2007

(54) COMPUTING CURRENT IN A DIGITAL CIRCUIT BASED ON AN ACCURATE CURRENT MODEL FOR LIBRARY CELLS

(75) Inventors: Subodh M. Reddy, San Jose, CA (US); Rajeev Murgai, Santa Clara, CA (US)

(73) Assignee: Fujitsu Limited, Kawasaki (JP)

( * ) Notice: Subject to any disclaimer, the term of this patent is extended or adjusted under 35 U.S.C. 154(b) by 296 days.

(21) Appl. No.: 11/096,138

(22) Filed: Mar. 31, 2005

(65) Prior Publication Data
US 2006/0225009 A1    Oct. 5, 2006

(51) Int. Cl.
*G06F 17/50* (2006.01)
(52) U.S. Cl. .............................. 716/4; 716/1
(58) Field of Classification Search .............. 716/1, 716/4; 703/13–14
See application file for complete search history.

(56) References Cited

U.S. PATENT DOCUMENTS

| | | | |
|---|---|---|---|
| 7,007,252 B2* | 2/2006 | Gyure et al. | 716/5 |
| 7,007,256 B2* | 2/2006 | Sarkar et al. | 716/6 |
| 2004/0034838 A1* | 2/2004 | Liau | 716/4 |
| 2004/0177328 A1* | 9/2004 | Sarkar et al. | 716/1 |
| 2005/0005254 A1* | 1/2005 | Hirano et al. | 716/5 |
| 2006/0112357 A1* | 5/2006 | Nazarian et al. | 716/4 |
| 2006/0123366 A1* | 6/2006 | Ogawa | 716/5 |
| 2006/0150134 A1* | 7/2006 | Shinomiya | 716/11 |
| 2006/0184904 A1* | 8/2006 | Murgai et al. | 716/4 |

OTHER PUBLICATIONS

Albuquerque et al., "Evaluation of Substrate Noise in CMOS and Low-Power Logic Cells," ISCAS, Conference Proceedings, vol. IV, 6 pages, 2001.

Badaroglu et al., "High-Level Simulation of Substrate Noise Generation from Large Digital Circuits with Multiple Supplies," IEEE 2001, pp. 326-330, 2001.

Briaire et al., "Principles of Substrate Crosstalk Generation in CMOS Circuits," TRANSCAD, vol. 19, No. 6, Jun. 2000.

(Continued)

*Primary Examiner*—Stacy Whitmore
(74) *Attorney, Agent, or Firm*—Baker Botts L.L.P.

(57) ABSTRACT

In one embodiment, a method for computing current in a digital circuit based on an accurate current model for library cells includes accessing a cell library, for each cell in the cell library corresponding to a cell in a digital circuit, generating multiple waveforms of current drawn by the cell from a power supply according to one or more predetermined values of one or more input parameters of the cell, analyzing the digital circuit to determine one or more actual values of the input parameters of each cell in the digital circuit, for each of the cells in the digital circuit, generating a current waveform according to the determined actual values of the input parameters and a waveform of current drawn by the cell from the power supply generated by the characterization module corresponding to the determined actual values of the input parameters, and summing the current waveforms of the cells in the digital circuit to generate a waveform of current drawn by the digital circuit from the power supply for use in a pattern-dependent methodology (PDM) or a patten-independent methodology (PIM).

34 Claims, 5 Drawing Sheets

OTHER PUBLICATIONS

Charbon et al., "Modeling Digital Substrate Noise Injection in Mixed-Signal IC's," TRANSCAD, vol. 18, No. 3, Mar. 1999.

Heijningen et al., "High-Level Simulation of Substrate Noise Generation Including Power Supply Noise Coupling," DAC, 2000.

Heijningen et al., "Substrate Noise Generation in Complex Digital Systems: Efficient Modeling and Simulation Methodology and Experimental Verification," IEEE JSSC, vol. 37, No. 8, Aug. 2002.

Heijningen et al., "Modeling of Digital Substrate Noise Generation and Experimental Verification Using a Novel Substrate Noise Sensor", 1993.

Murgai et al., "Sensitivity-Based Modeling and Methodology for Full-Chip Substrate Noise Analysis," DATE, 2004.

Nagata et al., "Modeling Substrate Noise Generation in CMOS Digital Integrated Circuits," CICC, 2002.

Nagata et al., "Substrate Noise Analysis with Compact Digital Noise Injection and Substrate Models," Int'l Conf. on VLSI Design, 2002.

Nagata et al., "Measurements and Analyses of Substrate Noise Waveform in Mixed-Signal IC Environment," TRANSCAD, vol. 19, No. 6, Jun. 2000.

Nagata et al., Effects of Power-Supply Parasitic Components on Substrate Noise Generation in Large-Scale Digital Circuits, Symp. on VLSI Circuits, Digest of Technical Papers, 2001.

Nardi et al., "A Methodology for the Computation of an Upper Bound on Noise Current Spectrum of CMOS Switching Activity," ICCAD, pp. 778-785, Nov. 2003.

Ozis et al., "An Efficient Modeling Approach for Substrate Noise Coupling Analysis," ISCAS, pp. 237-240, 2002.

Samavedam et al., "A Scalable Substrate Noise Coupling Model for Design of Mixed-Signal IC's", IEEE JSSC, vol. 35, No. 6, Jun. 2000.

Verghese et al., "Simulation Techniques and Solutions for Mixed-Signal Coupling in Integrated Circuits," Kluwer Academic Publishers, 1995.

Zanella et al, "Modeling of Substrate Noise Injected by Digital Libraries," ISQED, pp. 448-492, 2001.

Zinzius et al., "Evaluation of the Substrate Noise Effect on Analog Circuits in Mixed-Signal Designs," Southwest Symp. on mixed-signal designs, pp. 131-134, 2000.

* cited by examiner

COMPUTING CURRENT IN A DIGITAL CIRCUIT BASED ON AN ACCURATE CURRENT MODEL FOR LIBRARY CELLS

TECHNICAL FIELD OF THE INVENTION

This invention relates generally to designing chips and more particularly to computing current in a digital circuit based on an accurate current model for library cells.

BACKGROUND

In digital circuits, the current drawn from the power supply is a fundamental problem, with applications in several areas such as substrate noise analysis (SNA) of mixed-signal systems, power dissipation in digital circuits, and interconnect reliability (for instance, due to electromigration). Of interest are both instantaneous current in response to the transitions at the circuit inputs in a given clock cycle and the maximum current over all possible input transitions.

Designers typically use a circuit simulator, such as SPICE, for current, noise and power analysis. The circuit model typically consists of a composition of accurate device and interconnect models. However, it is not feasible to simulate such a circuit model on a circuit with even 100,000 gates. With chip complexity up to millions of gates, it is important to derive high-level models and methodologies to enable an efficient yet accurate chip-level current analysis. The results of research into deriving such reduced models (RMs) have been unsatisfactory. The resulting RMs are typically inaccurate or unsuitable for chip-level analysis.

SUMMARY

According to the present invention, disadvantages and problems associated with chip design may be reduced or eliminated.

In one embodiment, a method for computing current in a digital circuit based on an accurate current model for library cells includes accessing a cell library, for each cell in the cell library corresponding to a cell in a digital circuit, generating multiple waveforms of current drawn by the cell from a power supply according to one or more predetermined values of one or more input parameters of the cell, analyzing the digital circuit to determine one or more actual values of the input parameters of each cell in the digital circuit, for each of the cells in the digital circuit, generating a current waveform according to the determined actual values of the input parameters and a waveform of current drawn by the cell from the power supply generated by the characterization module corresponding to the determined actual values of the input parameters, and summing the current waveforms of the cells in the digital circuit to generate a waveform of current drawn by the digital circuit from the power supply for use in a pattern-dependent methodology (PDM) or a patten-independent methodology (PIM).

Particular embodiments of the present invention may provide one or more technical advantages. As an example, particular embodiments may provide an accurate current-modeling technique based on precharacterizing library cells for current drawn from a power supply as a function of time, load capacitance, input transitions, and slews (or transition times). In particular embodiments, this technique may be embedded into pattern-dependent methodologies, pattern-independent methodologies, or both. In particular embodiments, this technique may be applied to substrate noise analysis of mixed-signal systems and power dissipation in a digital circuit. For SNA, particular embodiments may provide a noise model that accurately accounts for effects of a package on substrate noise. Particular embodiments may provide a methodology for accurate SNA of a chip-level mixed-signal design. In other words, given any point p in the substrate, the methodology may, in particular embodiments, generate the worst time-domain and frequency-domain voltage waveform at p. Particular embodiments focus on the time-domain response and the peak-to-peak substrate noise, which are important metrics because, due to the body effect, any fluctuation in substrate reference potential changes the threshold voltage of the devices, playing havoc with the noise margins. Analog devices are especially sensitive to substrate reference potential changes. Particular embodiments may provide an accurate RM that simulates fast. For power dissipation, particular embodiments may provide methodologies for accurate computation of power dissipated in a digital circuit.

Particular embodiments provide an accurate time-domain waveform of current drawn from a power supply by a digital circuit. Particular embodiments may provide such a waveform for both PDMs—where primary input patterns are provided—and PIMs—where estimates of maximum peak-to-peak current over all input patterns are generated. Particular embodiments may be embedded in pattern-dependent flows and pattern-independent flows, either for noise analysis or for analysis of power dissipation. Pattern-dependent methodologies may be more accurate, but require more central processing unit (CPU) time. Pattern-independent methodologies are faster, but less accurate. Particular embodiments provide a current-waveform generation technique that is based on library cell characterization and is more accurate than previous approaches. Such previous approaches typically failed to take into account dependence of current on output load and input slews. In contrast, particular embodiments take into account dependence of current on output load and input slews. Particular embodiments may be extended to frequency analysis. Particular embodiments may be modified to take into account transistor leakage current, in addition to power supply noise, when analyzing substrate noise (SN).

Particular embodiments may provide all, some, or none of the technical advantages described above. Particular embodiments may provide one or more other technical advantages, one or more of which may be apparent, from the figures, descriptions, and claims herein, to a person having ordinary skill in the art

BRIEF DESCRIPTION OF THE DRAWINGS

To provide a more complete understanding of the present invention and the features and advantages thereof, reference is made to the following description, taken in conjunction with the accompanying drawings, in which.

DESCRIPTION OF EXAMPLE EMBODIMENTS

Figure 1:
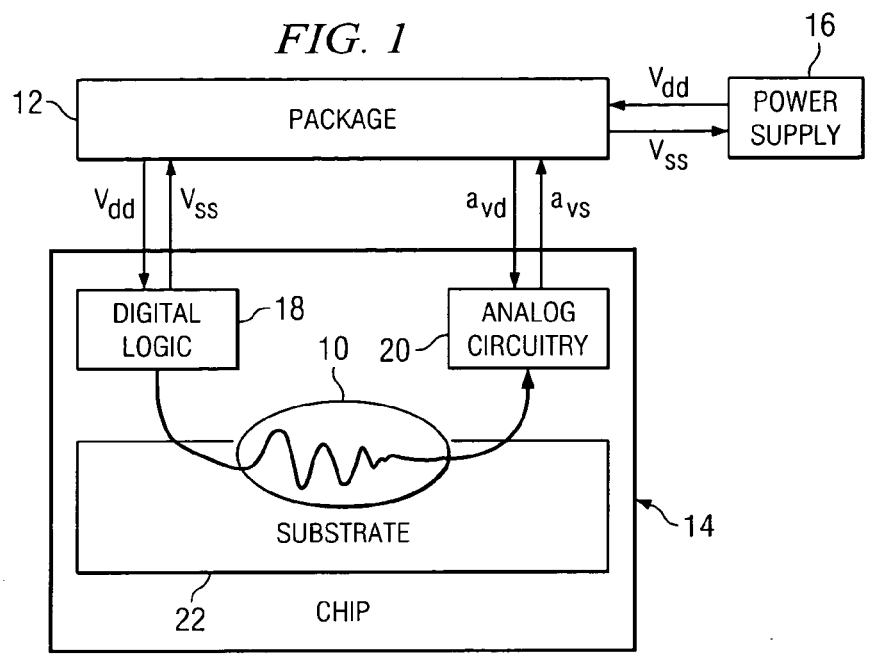
FIG. 1 illustrates example SN in a mixed-signal system.

FIG. 1 illustrates example SN 10 in a mixed-signal system. Package 12 holds chip 14. In particular embodiments, chip 14 is an SoC device. Chip 14 includes digital logic 18, analog circuitry 20, and substrate 22. Substrate 22 is common to both digital logic 18 and analog circuitry 20. In particular embodiments, digital logic 18 and analog circuitry 20 are physically separate from each other. In particular embodiments, digital logic 18 and analog circuitry 20 are not physically separate from each other. Power supply 16 supplies power to chip 14. As an example and not by way of limitation, power supply 16 may generate a voltage difference, $V_{DD}$-$V_{SS}$, across one or more components of digital logic 18. $V_{DD}$ and $V_{SS}$ may be drain and source voltages, respectively, for digital logic 18. Power supply 16 may also generate a voltage difference, $A_{VD}$-$A_{VS}$, across one or more components of analog circuitry 20. $A_{VD}$ and $A_{VS}$ may be drain and source voltages, respectively, for analog circuitry 20.

SN 10 includes switching noise from transients in digital logic 18 that propagates through substrate 22, reaches analog circuitry 20, and adversely affects operation of analog circuitry 20. Leakage currents and power supply noise (or simultaneous switching noise) both contribute to SN 10. Junctions between wells and substrate 22 and between sources and drains and their respective wells form reverse-biased, parasitic diodes that conduct leakage currents to substrate 22. Inputs to gates in digital logic 18 draw current from power supply 16, and, because of resistance and inductance associated with current delivered from power supply 16 to digital logic 18, potentials associated with power supply 16 and a ground network change both spatially and temporally, which causes power supply noise and ground bounce. Because substrate 22 is connected to a ground potential, such ground bounce is reflected as SN 10. Power supply noise and ground bounce tend to contribute to SN 10 much more than leakage current does.

Because power supply noise is typically the biggest contributor to SN 10, a main component of RMs for SNA is typically a total current, I, drawn from power supply 16 by cells in digital logic 18. Such current has a significant impact on SN 10 and should be modeled accurately. Reference to a gate may encompass a cell, and vice versa, where appropriate. Reference to a gate may encompass a gate in the actual design of digital logic 18, where appropriate. Reference to a library cell may encompass a library element, where appropriate. As an example and not by way of limitation, a gate may be an instance of a library cell. Particular embodiments provide an accurate current-modeling technique based on precharacterizing library cells for current drawn from power supply 16 as a function of time, load capacitance, input transitions, and slews. Such precharacterization may be embedded in pattern-dependent SNA methodologies and in pattern-independent SNA methodologies.

Figure 2:
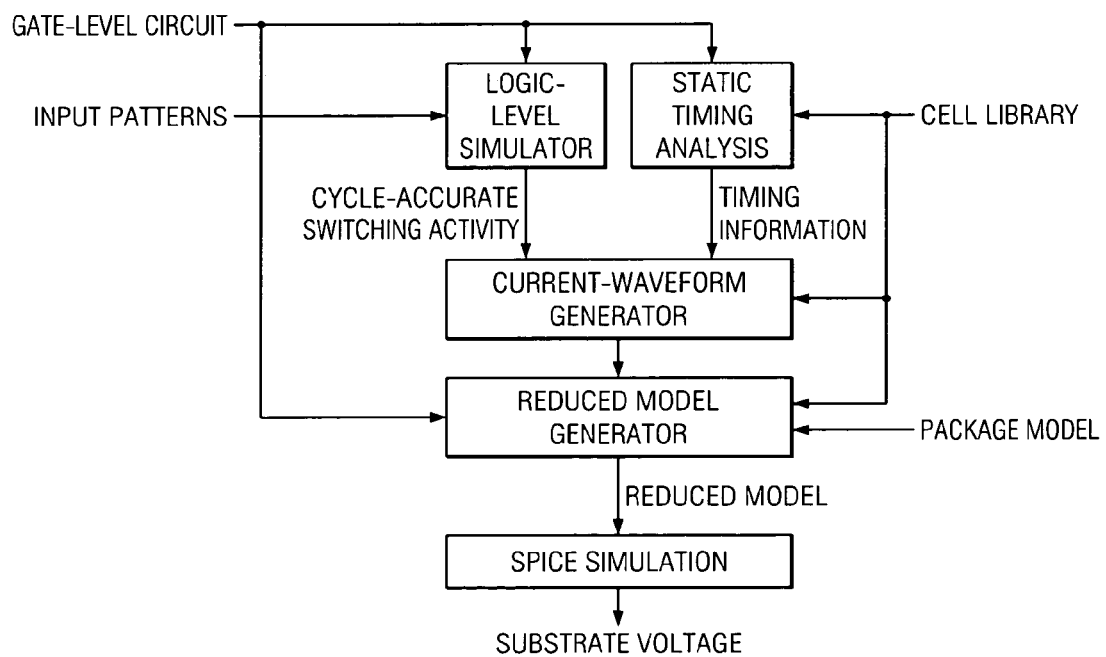
FIG. 2 illustrates an example PDM for SNA.

A common feature of research into modeling SN 10 during design is use of a RM of digital logic 18. FIG. 2 illustrates an example PDM for SNA. In particular embodiments, one or more of the components illustrated in FIG. 2—such as the logic-level simulator, the static timing analysis module, the current waveform generator, the RM generator, and the SPICE simulator—include a hardware, software, or embedded logic component or a combination of two or more such components. In the PDM illustrated in FIG. 2, a digital gate-level circuit and a testbench consisting of input vectors is provided. Each cell in the library is simulated with SPICE for all possible inputs, and power supply current and substrate injection currents are extracted. The digital circuit is simulated for each input vector. The gates that switch and their switching times are recorded. This information is used to derive the total current I(t) that the digital circuit draws from the power supply. This current is, in turn, embedded into an RM, which is simulated to yield an SN waveform. A drawback of this methodology is that, when a worst-case scenario is not in the test bench, this methodology may fail to capture a worst-case noise pattern. This methodology is also too CPU-intensive to be practical for a full-chip analysis. Another drawback of this methodology is that this methodology typically does not consider package inductance and power supply noise associated with package inductance. Library-cell characterization carried out in this methodology is typically inaccurate for a current waveform, because such library-cell characterization does not take into account gate output load and input slew. This methodology also typically fails to consider dependency of noise on a load at each gate.

Figure 3:
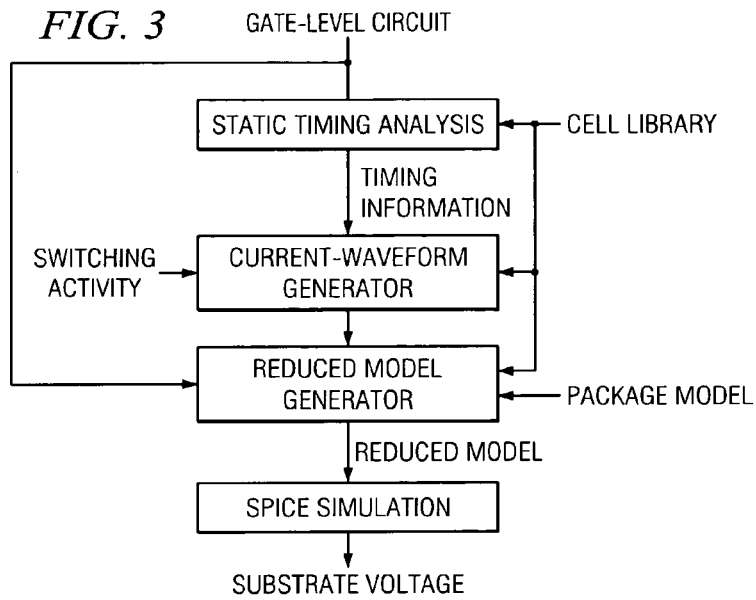
FIG. 3 illustrates an example PIM for SNA.
Figure 4:
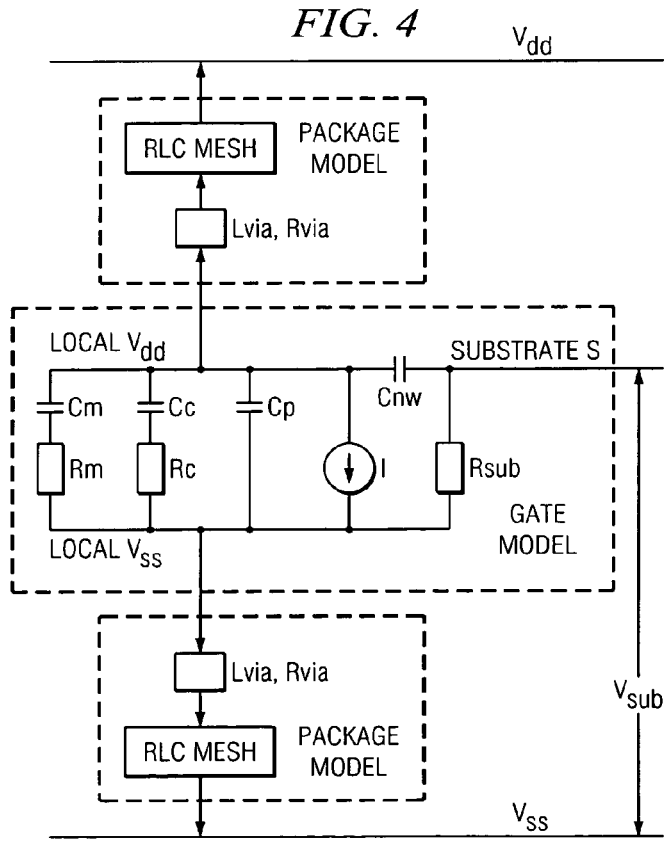
FIG. 4 illustrates an example RM useable in the PIM illustrated in FIG. 3.

FIG. 3 illustrates an example PIM for SNA that is suitable for chip-level designs and addresses at least some of the drawbacks described above. This methodology does not use any testbench and is much faster than pattern-dependent flows. This methodology is also based on deriving an RM of the digital part of the design. In particular embodiments, one or more of the components illustrated in FIG. 3—such as the static timing analysis module, the current waveform generator, the RM generator, and the SPICE simulator—include a hardware, software, or embedded logic component or a combination of two or more such components. FIG. 4 illustrates an example RM useable in the PIM illustrated in FIG. 3. For this methodology, the RM may be enhanced by more accurately modeling components having greater effects on SN, such as current I. First, a static timing analysis (STA) tool generates timing information for each gate, such as the minimum and maximum rise/fall arrival and transition times. This, along with the switching activity information, is used by the current waveform generation algorithm to construct the current waveform I used in the RM. The current drawn by a single switching digital gate g is modeled as $$C \frac{V_{DD}}{\Delta T},$$

where C is the capacitive load driven by g and $\Delta T$ is the transition time at the output of g. Maximal sets of gates which can switch simultaneously are determined, leading to the computation of maximum current I drawn from the power supply. This current is embedded in the RM. The package model is also incorporated into the RM. The RM is simulated in SPICE to yield SN voltage. Switching activities of various blocks in the design may be provided by the designer; otherwise they may be deduced from a simulation testbench. Load capacitance-based (LCB) modeling schemes tend to suffer from inaccurate modeling of the current waveform, since these schemes only focus on determining a maximum current value. This can result in large errors in SN in the presence of the package inductance, for which not only is a maximum value of current I important, but also its maximum slope. As a result, there are circuits on which the discrepancy vis-à-vis the reference model is quite large. For small designs that SPICE may simulate in a reasonable amount of time, a reference or detailed substrate model may be derived and simulated for substrate voltage. Reference to a small design may encompass one or more blocks, and vice versa, where appropriate. The reference model is used to validate the RM. The reference model is derived from the transistor-level netlist for each cell in the design. It also includes substrate network, a circuit to model the substrate. The models for all the cells in the design are then composed and optionally integrated with the package model to generate the complete reference model for the design. Particular embodiments may use BSIM3 transistor models. Particular embodiments may use other models, such as BSIM4 transistor models.

Figure 5:
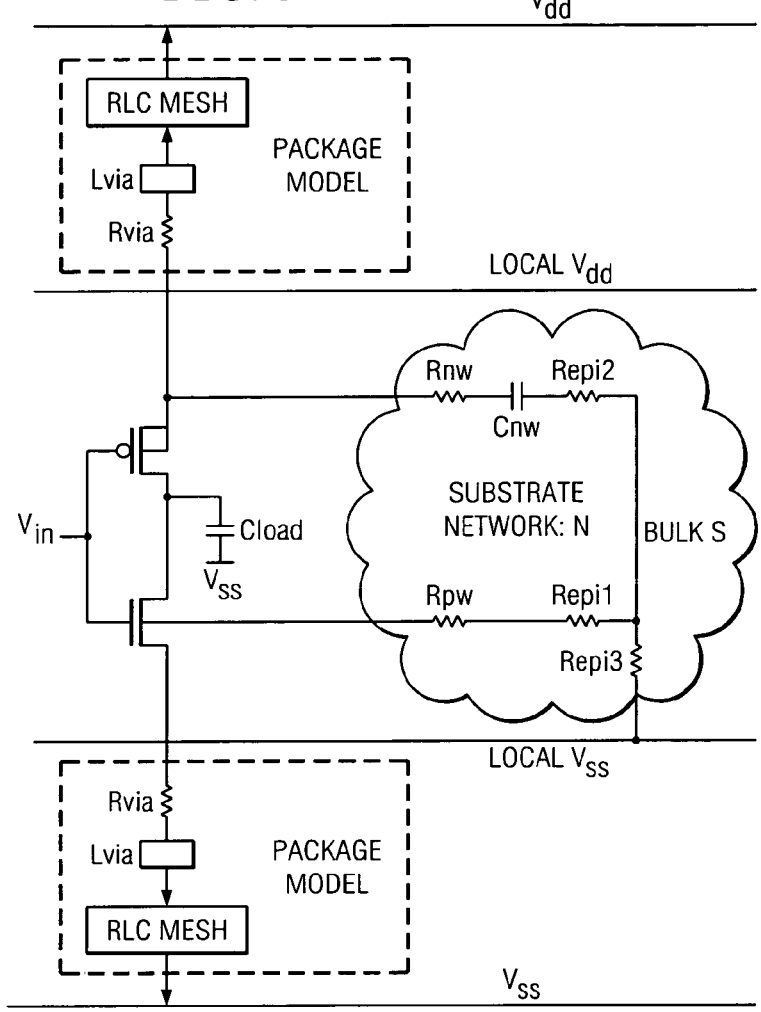
FIG. 5 illustrates an example reference model for a design including a single inverter.

FIG. 5 illustrates an example reference model for a design including a single inverter. Although for simplicity NMOS and PMOS transistors are shown, in the actual model these transistors may be replaced by their BSIM3 models. The substrate network N and the package model are also shown. For a given cell, the model contains one substrate node referred to as BULK or S. The substrate noise is measured at the BULK S node. The PMOS transistor substrate node is connected to S through a series connection of a capacitor $C_{nw}$ and a resistor $R_{epi2}$. $C_{nw}$ represents the reverse-biased NWELL to P-epi layer junction diode and $R_{epi2}$ represents the P-epi layer resistance under the NWELL area. For an NMOS transistor, its substrate node is connected to S through a resistor $R_{epi1}$ (the P-epi layer resistance under the transistor). Each block has local $V_{DD}$, local $V_{SS}$, and one BULK S node. S nodes of all the cells are connected to the block S node. The local $V_{SS}$ and $V_{DD}$ nodes are connected to the package models, which, in turn, are connected to the external $V_{SS}$ and $V_{DD}$ lines, respectively.

LCB modeling tends to yield inaccurate results vis-à-vis the reference model; the discrepancy between the models may be as large as approximately 315%. Possible reasons for such inaccuracy include the following:

1. LCB modeling models current for a switching cell as $$I = C \frac{V_{DD}}{\Delta T}.$$

This is an approximation of the actual charging current, $$C \frac{dv}{dt},$$

and may contribute significantly to the inaccuracy.

2. The current waveform is initially modeled as a rectangular pulse. Later, after the current for the entire design is derived, the discontinuities are smoother by replacing vertical lines with slanted lines (which are not illustrated). The impact of this approximation on $$L \frac{di}{dt}$$

noise may be significant.

3. LCB modeling only models switching at the output stage of a cell. It ignores the current contribution of internal stages that are switching.

4. LCB modeling ignores SN contribution due to switching inputs that do not result in an output transition. In this case, even though the magnitude of the current through the gate may be negligible, the presence of inductance may inject substantial SN.

Particular embodiments provide an alternative to LCB modeling: cell current characterization (CCC)—based scheme. In this, each library cell for the current I(t) drawn from the power supply is precharacterized. This current is a function of the input values/transitions, the input slews, and the output load. There is no restriction on the set of inputs that can make a transition. But all inputs making simultaneous transitions are assumed to start at the same time instance. In other words, all overlapping transitions are adjusted such that the arrival time of these transitions are aligned to start at the same time point, which is the average of these overlapping arrival times. Each of these transitions can be either rising or falling. The characterization data, i.e., the current waveform I(t), is generated using HSPICE for a set of discrete input slews $(s_1, s_2, \ldots, s_w)$ and output load values $(c_1, c_2, \ldots, c_w)$. Let $I(t, \vec{K}, s_i, c_j)$ denote the current waveform corresponding to the slew $s_i$ for input values/transitions $\vec{K}$ and output load $c_j$.

Assume that we have a gate g in the circuit, driving a load C. Let us assume for simplicity that only one input x of g switches at time α with transition time ΔT. Further, the output o of g switches as a result of the switching input x. Let $\vec{K}$ denote the values of inputs at time α. We wish to compute the current drawn from $V_{DD}$ as a function of time. Let ΔT lie between $s_i$ and $s_{i+1}$. Let C lie between $c_j$ and $C_{j+1}$. We derive $I(t, \vec{K}, \Delta T, C)$ from the pre-computed waveforms $I(t, \vec{K}, s_i, c_j)$, $I(t, \vec{K}, s_{i+1}, c_j)$, $I(t, \vec{K}, s_i, c_{j+1})$, and $I(t, \vec{K}, s_{i+1}, c_{j+1})$ using linear interpolation.

Figure 6:
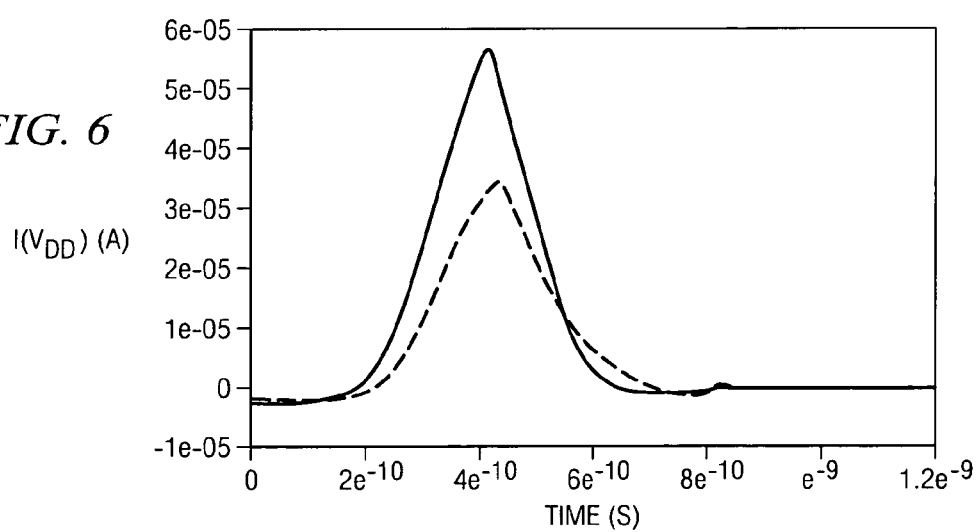
FIG. 6 illustrates an example current waveform through $V_{DD}$ when slew is fixed and load is varied.
Figure 7:
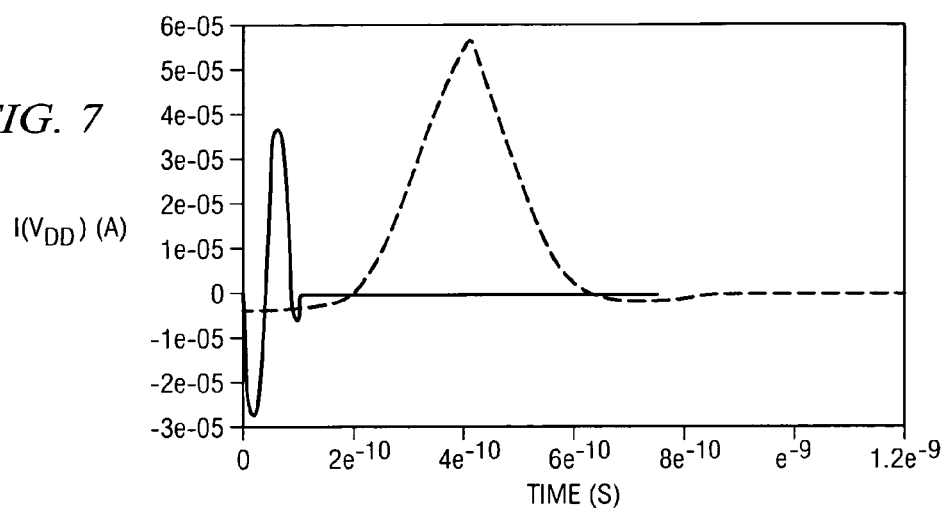
FIG. 7 illustrates an example current waveform through $V_{DD}$ when load is set to a constant load and two slew values are used.

FIG. 6 illustrates an example current waveform flowing through $V_{DD}$ when slew is fixed at 800 picoseconds and load is varied. The dotted line is for a load value of 1 femtofarad and the solid line is for a load value of 27 femtofarads. As the load varies from 1 femtofarad to 27 femtofarads, the current waveform changes linearly from the dotted curve to the solid curve. For the given slew, if the load lies between these two values, the current waveform may be obtained by linear interpolation. FIG. 7 illustrates an example current waveform through $V_{DD}$ when load is set to a constant load of 27 femtofarads and two slew values are used: 100 picoseconds and 800 picoseconds. The dotted curve is for slew value of 800 picoseconds and the sold curve is for slew value of 100 picoseconds. The current waveform starts as shown for slew value of 100 picoseconds and linearly approaches the current waveform for slew value of 800 picoseconds. The shift in time axis should be accounted for during linear interpolation.

Figure 8:
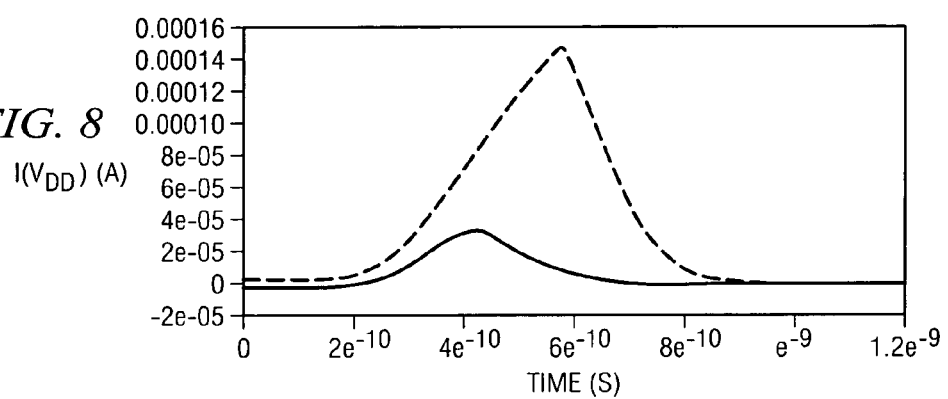
FIG. 8 illustrates example input vector sensitivity.

FIG. 8 illustrates example input vector sensitivity. For each gate in the input design, given its input transitions, input slew values, and the output load value, characterization data for entries corresponding to the concerned input transition is looked up. Next, the range in which the given load value lies is picked. The range will have two bounding load points for which various current waveforms for different input slews are present. Similarly a range that encloses the given slew value is also picked. Thus, there will be four bounding points. Each point will have a current waveform associated with it. In other words, at each time instance, these four points, which are associated with four current values, can be assumed to lie on a plane, whose x and y axis are load and slew values. Depending on the actual load and slew value, a point on the plane is picked through linear interpolation. This operation is performed over all time points present in the current waveforms stored in the characterization data. Then, this waveform is shifted to the right by α to obtain the desired current waveform. Note that if ΔT is greater than $s_v$ or less than $s_1$, extrapolation may be used.

The above operation is carried out for each gate in the design, resulting in a distinct current waveform associated with each gate. All these current waveforms are superimposed onto each other to generate one final current waveform to yield a current for the entire design. At each time instant, the current values for all the gates are summed up. The resulting current waveform is then plugged into the RM.

CCC is more accurate than LCB, since CCC incorporates current drawn by internal switching transistors of the cell in addition to the output transistors. However, CCC needs to generate and store current waveforms for each cell in the library for each discrete input slew and output load value for all possible input values. While this may represent a large amount of data, the data may be organized into an efficient database to reduce time requirements associated with accessing the data.

Particular embodiments concentrate on characterizing the current waveform because the RM is obtained by applying a series of network transformations. A current source and some passive elements constitute the RM. All the passive elements are statically derived. The current source is the only time-varying component which is obtained by the summation of the current flow through individual gates.

Figure 9:
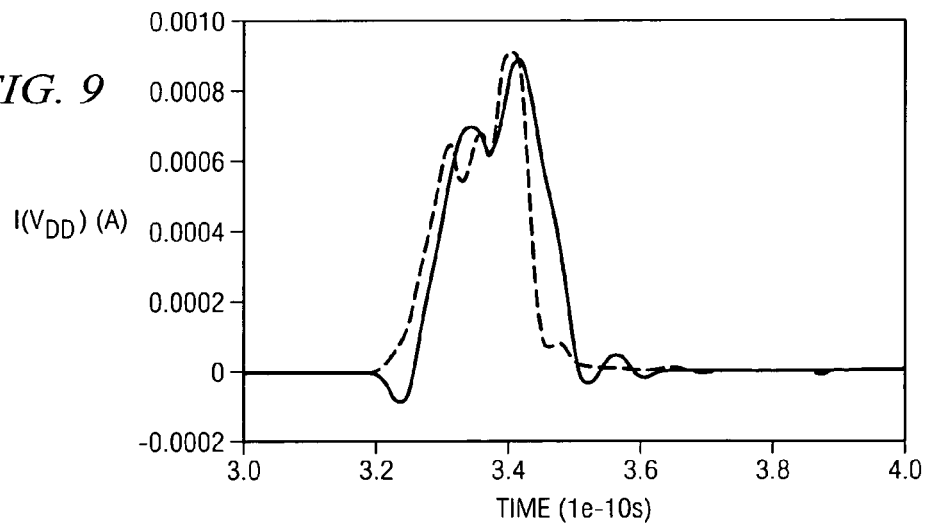
FIG. 9 illustrates an example actual current waveform through $V_{DD}$ and an example current waveform obtained through CCC.
Figure 10:
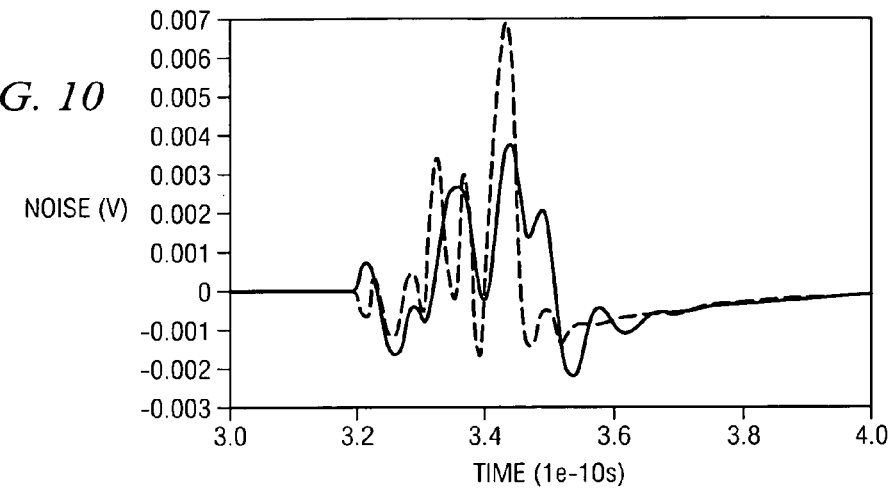
FIG. 10 illustrates example SN corresponding to the current waveforms illustrated in FIG. 9.

CCC may be incorporated into a PDM and a PIM as follows. For a PDM, given a sequence of input vectors, a logic simulator is used to determine gates with inputs switching in a given cycle and the logic value or transition direction at each gate pin p. The simulator also generates the signal arrival time at p. The slew at p is obtained using a static timing analysis tool. Given these input transitions, obtaining the current waveform is accomplished by a lookup operation on the a priori characterized data for that gate, as described above. Then, the waveforms corresponding to all the gates are added together as described above to generate the current waveform for the entire circuit. In a PIM, the gates are divided into falling and rising transitions with the goal of generating maximum SN. For each gate, an input transition that produces the given output transition with maximum SN is selected. This is done by maximizing the voltage V(S) at the substrate node S:

$$V(S) = RI(t) + L\frac{dI(t)}{d(t)},$$

where R(L) is the effective resistance (inductance) of the via and the package illustrated in FIG. 5. For instance, assume that, in the circuit, an OR gate g with inputs x and y is making a rising transition. This may correspond to x=0 and y rising, y=0 and x rising, or both x and y rising. Only those precharacterized current waveforms for the library cell of g which correspond to these three sets of input transitions are used. The waveform which maximizes the objective function V(S) is then selected. Once these input transitions for each gate are obtained, the circuit current waveform is computed based on the characterization data, as described above. FIG. 9 illustrates an example actual current waveform through $V_{DD}$ and an example current waveform obtained through CCC. FIG. 10 illustrates example SN corresponding to the current waveforms illustrated in FIG. 9. The solid-line curves represent actual values, and the dotted-line curves represent values obtained through CCC.

Figure 11:
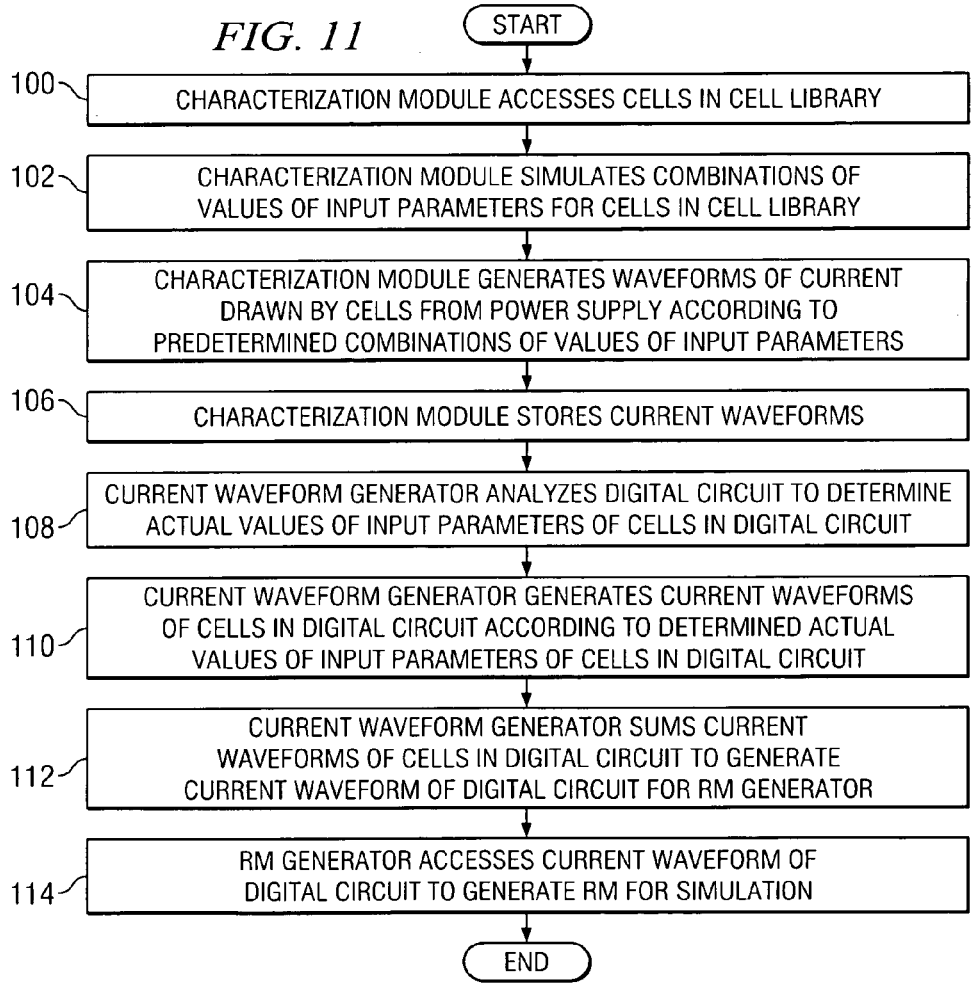
FIG. 11 illustrates an example method for modeling current for SNA.

FIG. 11 illustrates an example method for modeling current for SNA. The method begins at step 100, where a characterization module (which in particular embodiments includes a hardware, software, or embedded logic component or a combination of two or more such components) accesses one or more cells in a cell library. At step 102, the characterization module simulates every possible combination of values of the following input parameters of each accessed cell: input slew associated with one or more inputs of the cell; input vector; output load associated with the cell; and arrival time at one or more inputs of the cell. At step 104, the characterization module generates, according to predetermined combinations of values of the input parameters of each accessed cell, a waveform of current drawn by each accessed cell from a power supply. At step 106, the characterization module stores the generated current waveforms. At step 108, a current waveform generator analyzes a digital circuit to determine actual values of input parameters of cells in the digital circuit. At step 110, the current waveform generator accesses the stored current waveforms and generates a current waveform of each cell in the digital circuit according to the determined actual values of input parameters of cells in the digital circuit. At step 112, the current waveform generator sums the current waveforms of the cells in the digital circuit to generate a current waveform of the digital circuit corresponding to current that the digital circuit draws from power supply 16. At step 114, an RM generator accesses the current waveform of the digital circuit to generate an RM for simulation for SNA of chip 14, at which point the method ends. Although particular steps of the method illustrated in FIG. 11 have been illustrated and described as occurring in a particular order, the present invention contemplates any suitable steps of the method illustrated in FIG. 11 occurring in any suitable order.

Discussed above are particular embodiments to facilitate SNA with the proposed CCC scheme. Particular embodiments may, in addition or as an alternative, facilitate analysis of power dissipation in a chip-level digital circuit. The power dissipated in a circuit is given by $V_{DD}$ I, where $V_{DD}$ is the supply voltage and I is the current drawn by the circuit from the supply. In particular embodiments of the present invention, the current computed by CCC scheme may be used to compute the amount of power dissipated in a digital circuit. In such embodiments, both instantaneous power and maximum power may be computed. Current derived using a pattern-dependent methodology will yield instantaneous power, i.e., power dissipated in the circuit in each clock cycle as a function of the input vectors. The pattern-independent methodology will yield the maximum current and hence maximum power dissipated in the circuit over all possible input vectors.

One or more modifications to the present invention may be apparent to a person having ordinary skill in the art, and the present invention encompasses all such modifications that are within the scope of the appended claims. Statements in the specification that are not reflected in the appended claims do not limit the present invention.

What is claimed is:

1. A system for computing current in a digital circuit based on an accurate current model for library cells, the system comprising:
   a characterization module operable to:
     access a cell library;
     for each cell in the cell library corresponding to a cell in a digital circuit, generate a plurality of waveforms of current drawn by the cell from a power supply according to one or more predetermined values of one or more input parameters of the cell; and
   a current waveform generator operable to:
     analyze the digital circuit to determine one or more actual values of the input parameters of each cell in the digital circuit;
     for each of the cells in the digital circuit, generate a current waveform according to the determined actual values of the input parameters and a waveform of current drawn by the cell from the power supply generated by the characterization module corresponding to the determined actual values of the input parameters; and
     sum the current waveforms of the cells in the digital circuit to generate a waveform of current drawn by the digital circuit from the power supply for use in a pattern-dependent methodology (PDM) or a pattern-independent methodology (PIM).

2. The system of claim 1, wherein the input parameters comprise input slew, input vector, output load, and input arrival time.

3. The system of claim 1, wherein the current waveform generator uses linear interpolation to generate one or more of the current waveforms of one or more of the cells in the digital circuit.

4. The system of claim 1, wherein the current waveform generator generates the waveform of current drawn by the digital circuit from the power supply for analysis of power consumption by the digital circuit.

5. The system of claim 4, wherein the analysis of power consumption by the digital circuit comprises use of a PDM.

6. The system of claim 4, wherein the analysis of power consumption by the digital circuit comprises use of a PIM.

7. The system of claim 1, wherein the current waveform generator generates the waveform of current drawn by the digital circuit from the power supply for analysis of noise in a substrate associated with the digital circuit.

8. The system of claim 7, wherein the substrate is associated with analog circuitry in addition to being associated with the digital circuit.

9. The system of claim 7, further comprising a reduced model (RM) generator operable to generate an RM of the digital circuit according to the waveform of current drawn by the digital circuit from the power supply for the analysis of noise in the substrate.

10. The system of claim 7, wherein the analysis of noise in the substrate comprises use of a PDM.

11. The system of claim 7, wherein the analysis of noise in the substrate comprises use of a PIM.

12. A method for computing current in a digital circuit based on an accurate current model for library cells, the method comprising:
   accessing a cell library;
   for each cell in the cell library corresponding to a cell in a digital circuit, generating a plurality of waveforms of current drawn by the cell from a power supply according to one or more predetermined values of one or more input parameters of the cell;
   analyzing the digital circuit to determine one or more actual values of the input parameters of each cell in the digital circuit;
   for each of the cells in the digital circuit, generating a current waveform according to the determined actual values of the input parameters and a waveform of current drawn by the cell from the power supply generated by the characterization module corresponding to the determined actual values of the input parameters; and
   summing the current waveforms of the cells in the digital circuit to generate a waveform of current drawn by the digital circuit from the power supply for use in a pattern-dependent methodology (PDM) or a pattern-independent methodology (PIM).

13. The method of claim 12, wherein the input parameters comprise input slew, input vector, output load, and input arrival time.

14. The method of claim 12, wherein generating one or more of the current waveforms of one or more of the cells in the digital circuit comprises using linear interpolation.

15. The method of claim 12, further comprising using the waveform of current drawn by the digital circuit from the power supply for analysis of power consumption by the digital circuit.

16. The system of claim 15, wherein the analysis of power consumption by the digital circuit comprises use of a PDM.

17. The system of claim 15, wherein the analysis of power consumption by the digital circuit comprises use of a PIM.

18. The method of claim 12, further comprising using the waveform of current drawn by the digital circuit from the power supply for analysis of noise in a substrate associated with the digital circuit.

19. The method of claim 18, wherein the substrate is associated with analog circuitry in addition to being associated with the digital circuit.

20. The method of claim 18 further comprising generating a reduced model (RM) of the digital circuit according to the waveform of current drawn by the digital circuit from the power supply for the analysis of noise in the substrate.

21. The method of claim 18 wherein the analysis of noise in the substrate comprises use of a PDM.

22. The method of claim 18, wherein the analysis of noise in the substrate comprises use of a PIM.

23. Logic for computing current in a digital circuit based on an accurate current model for library cells, the logic encoded in one or more tangible media for execution and when executed operable to:
   access a cell library;
   for each cell in the cell library corresponding to a cell in a digital circuit, generate a plurality of waveforms of current drawn by the cell from a power supply according to one or more predetermined values of one or more input parameters of the cell;
   analyze the digital circuit to determine one or more actual values of the input parameters of each cell in the digital circuit;
   for each of the cells in the digital circuit, generate a current waveform according to the determined actual values of the input parameters and a waveform of current drawn by the cell from the power supply generated by the characterization module corresponding to the determined actual values of the input parameters; and sum the current waveforms of the cells in the digital circuit to generate a waveform of current drawn by the digital circuit from the power supply for use in a pattern-dependent methodology (PDM) or a pattern-independent methodology (PIM).

24. The logic of claim 23, wherein the input parameters comprise input slew, input vector, output load, and input arrival time.

25. The logic of claim 23, operable to use linear interpolation to generate one or more of the current waveforms of one or more of the cells in the digital circuit.

26. The logic of claim 23, further operable to use the waveform of current drawn by the digital circuit from the power supply for analysis of power consumption by the digital circuit.

27. The system of claim 26, wherein the analysis of power consumption by the digital circuit comprises use of a PDM.

28. The system of claim 26, wherein the analysis of power consumption by the digital circuit comprises use of a PIM.

29. The logic of claim 23, further operable to use the waveform of current drawn by the digital circuit from the power supply for analysis of noise in a substrate associated with the digital circuit.

30. The logic of claim 29, wherein the substrate is associated with analog circuitry in addition to being associated with the digital circuit.

31. The logic of claim 29, further operable to generate a reduced model (RM) of the digital circuit according to the waveform of current drawn by the digital circuit from the power supply for the analysis of noise in the substrate.

32. The logic of claim 29, wherein the analysis of noise in the substrate comprises use of a PDM.

33. The logic of claim 29, wherein the analysis of noise in the substrate comprises use of a PIM.

34. A system for computing current in a digital circuit based on an accurate current model for library cells, the system comprising:

means for accessing a cell library;

means for, for each cell in the cell library corresponding to a cell in a digital circuit, generating a plurality of waveforms of current drawn by the cell from a power supply according to one or more predetermined values of one or more input parameters of the cell;

means for analyzing the digital circuit to determine one or more actual values of the input parameters of each cell in the digital circuit;

means for, for each of the cells in the digital circuit, generating a current waveform according to the determined actual values of the input parameters and a waveform of current drawn by the cell from the power supply generated by the characterization module corresponding to the determined actual values of the input parameters; and means for summing the current waveforms of the cells in the digital circuit to generate a waveform of current drawn by the digital circuit from the power supply for use in a pattern-dependent methodology (PDM) or a pattern-independent methodology (PIM).

* * * * *

UNITED STATES PATENT AND TRADEMARK OFFICE
CERTIFICATE OF CORRECTION

PATENT NO. : 7,313,771 B2
APPLICATION NO. : 11/096138
DATED : December 25, 2007
INVENTOR(S) : Subodh M. Reddy et al.

Page 1 of 1

It is certified that error appears in the above-identified patent and that said Letters Patent is hereby corrected as shown below:

Column 5, Line 65, after "discontinuities are" delete "smoother" and insert --smoothened--.

Signed and Sealed this

Thirteenth Day of January, 2009

JON W. DUDAS
*Director of the United States Patent and Trademark Office*